(12) United States Patent
Jung et al.

(10) Patent No.: US 12,237,241 B2
(45) Date of Patent: Feb. 25, 2025

(54) SEMICONDUCTOR PACKAGE

(71) Applicant: SAMSUNG ELECTRONICS CO., LTD., Suwon-si (KR)

(72) Inventors: Yanggyoo Jung, Gwangmyeong-si (KR); Seungbin Baek, Suwon-si (KR); Hyunjung Song, Hwaseong-si (KR); Jisun Yang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 276 days.

(21) Appl. No.: 17/718,662

(22) Filed: Apr. 12, 2022

(65) Prior Publication Data

US 2023/0011941 A1 Jan. 12, 2023

(30) Foreign Application Priority Data

Jul. 8, 2021 (KR) ........................ 10-2021-0089519

(51) Int. Cl.
| | |
|---|---|
| *H01L 23/31* | (2006.01) |
| *H01L 21/48* | (2006.01) |
| *H01L 21/56* | (2006.01) |
| *H01L 23/00* | (2006.01) |
| *H01L 23/498* | (2006.01) |
| *H01L 25/065* | (2023.01) |

(52) U.S. Cl.
CPC ...... *H01L 23/3185* (2013.01); *H01L 21/4853* (2013.01); *H01L 21/486* (2013.01); *H01L 21/565* (2013.01); *H01L 23/49827* (2013.01); *H01L 23/49838* (2013.01); *H01L 23/562* (2013.01); *H01L 24/16* (2013.01); *H01L 25/0652* (2013.01); *H01L 2224/16227* (2013.01); *H01L 2924/18161* (2013.01); *H01L 2924/3511* (2013.01); *H01L 2924/3512* (2013.01)

(58) Field of Classification Search
None
See application file for complete search history.

(56) References Cited

U.S. PATENT DOCUMENTS

| | | |
|---|---|---|
| 7,936,060 B2 | 5/2011 | Andry et al. |
| 8,178,984 B2 | 5/2012 | Corisis et al. |

(Continued)

*Primary Examiner* — Long Pham
(74) *Attorney, Agent, or Firm* — F. CHAU & ASSOCIATES, LLC

(57) ABSTRACT

A semiconductor package includes: a package substrate; an interposer disposed on the package substrate; a first semiconductor chip mounted on the interposer; a second semiconductor chip mounted on the interposer adjacent to the first semiconductor chip, the second semiconductor chip having an overhang portion that does not overlap the interposer in a vertical direction; a first underfill disposed between the package substrate and the interposer, the first underfill having a first extension portion extending from a side surface of the interposer; a second underfill disposed between the interposer and the second semiconductor chip, the second underfill having a second extension portion extending to an upper surface of the package substrate along at least a portion of the first extension portion of the first underfill, wherein the second extension portion protrudes from the overhang portion contact the upper surface of the package substrate.

20 Claims, 11 Drawing Sheets

(56) References Cited

U.S. PATENT DOCUMENTS

| | | |
|---|---|---|
| 9,780,072 B2 | 10/2017 | Jeng et al. |
| 11,810,833 B2 * | 11/2023 | Hung ................. H01L 21/67126 |
| 11,972,995 B2 * | 4/2024 | Park ........................ H01L 25/50 |
| 2009/0032926 A1 | 2/2009 | Sharifi |
| 2011/0012249 A1 | 1/2011 | Daubenspeck et al. |
| 2014/0077387 A1 | 3/2014 | Chuang et al. |
| 2015/0194361 A1 | 7/2015 | Hou et al. |
| 2015/0228614 A1 | 8/2015 | Interrante et al. |
| 2016/0079201 A1 * | 3/2016 | Do .......................... H01L 24/81 |
| | | 29/830 |
| 2020/0312755 A1 * | 10/2020 | Choi ................... H01L 23/5384 |
| 2020/0395313 A1 * | 12/2020 | Mallik .................. H01L 21/486 |
| 2023/0154892 A1 * | 5/2023 | Tu .......................... H01L 24/17 |
| | | 257/668 |

* cited by examiner

SEMICONDUCTOR PACKAGE

CROSS-REFERENCE TO RELATED APPLICATION

This application claims priority under 35 U.S.C. § 119 to Korean Patent Application No. 10-2021-0089519, filed on Jul. 8, 2021 in the Korean Intellectual Property Office, the disclosure of which is incorporated by reference herein in its entirety.

TECHNICAL FIELD

The present inventive concept relates to a semiconductor package, and more particularly, to a semiconductor package with an underfill structure.

DISCUSSION OF THE RELATED ART

Semiconductor devices may include a system in package (SIP) for mounting a plurality of semiconductor chips in a single package. The system in package (SIP) devices may be implemented in a "2.5D" structure, in which multiple semiconductor chips are connected through an interposer layer disposed between a substrate and the semiconductor chips.

In some cases, the interposer layer may include a through silicon via (TSV) in order to form fine wirings connecting semiconductor chips in the package.

SUMMARY

An aspect of the present inventive concept is to provide a semiconductor package having increased reliability and yield.

According to an aspect of the present inventive concept, a semiconductor package includes: a package substrate; an interposer disposed on the package substrate; a first semiconductor chip mounted on the interposer; a second semiconductor chip mounted on the interposer adjacent to the first semiconductor chip, wherein the second semiconductor chip includes an overhang portion that does not overlap the interposer in a direction that is perpendicular to an upper surface of the interposer; a first underfill disposed between the package substrate and the interposer, the first underfill having a first extension portion extending from a side surface of the interposer; a second underfill disposed between the interposer and the second semiconductor chip, the second underfill having a second extension portion extending to an upper surface of the package substrate along at least a portion of the first extension portion of the first underfill, wherein the second extension portion protrudes from the overhang portion to contact with the upper surface of the package substrate.

According to an aspect of the present inventive concept, a semiconductor package includes: a package substrate; an interposer disposed on the package substrate; a first semiconductor chip mounted on the interposer; a plurality of second semiconductor chips mounted on the interposer and spaced apart from the first semiconductor chip, the plurality of second semiconductor chips having an overhang portion protruding from the interposer in a direction that is parallel to an upper surface of the interposer; a first underfill covering a lower surface of the interposer, and including a first extension portion extending along the package substrate, wherein the first extension portion does not overlap the interposer in a direction that is perpendicular to the upper surface of the interposer, and a second underfill covering a lower surface of each of the plurality of second chips, and having a second extension portion extending along at least a portion of the first extension portion of the first underfill to contact an upper surface of the package substrate, wherein the first and second semiconductor chips are electrically connected through the interposer, wherein a portion of the plurality of second semiconductor chips protrude from a first side of the interposer, wherein a remaining portion of the plurality of second semiconductor chips may protrude from a second side opposite to the first side of the interposer, and wherein the protrusions of the portion and of the remaining portion of the plurality of second semiconductor chips form the overhang portion.

According to an aspect of the present inventive concept, a semiconductor package, includes: an interposer disposed on a package substrate; a semiconductor chip disposed on the interposer; a first underfill covering a lower surface of the interposer; and a second underfill covering a lower surface of the semiconductor chip, wherein at least a portion of the semiconductor chip forms an overhang portion protruding from one side surface of the interposer, wherein the second underfill has an extension portion extending from a lower surface of the overhang portion to the package substrate, wherein the extension portion covers a side surface of the interposer and a portion of the first underfill, and protrudes from the overhang portion of the semiconductor chip in a plan view.

BRIEF DESCRIPTION OF DRAWINGS

The above and other features of the present inventive concept will be more clearly understood from the following detailed description taken in conjunction with the accompanying drawings, in which.

DETAILED DESCRIPTION

Figure 1A:
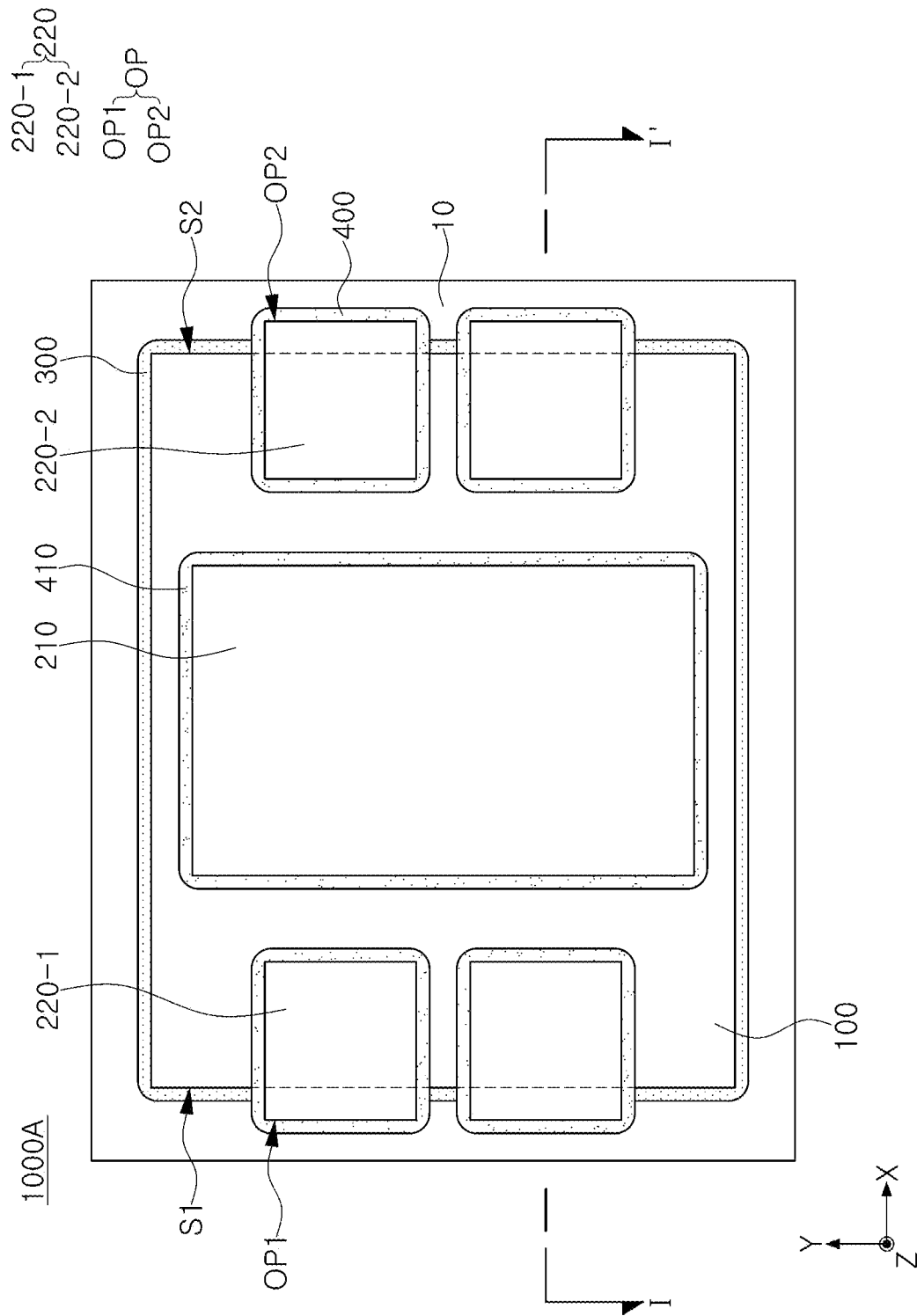
FIG. 1A is a plan view that illustrates a semiconductor package according to an example embodiment of the present inventive concept.

Hereinafter, embodiments of the present disclosure will be described with reference to the accompanying drawings. Like reference symbols in the drawings may denote like elements, and to the extent that a description of an element has been omitted, it may be understood that the element is at least similar to corresponding elements that are described elsewhere in the specification.

As used herein, a plan view refers to orthographic projection view of the embodiment from the position of a horizontal plane through the object. For example, the plan view of an embodiment may be a "top down" sectional view of the embodiment.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and might not limit the sequence or importance of the elements. In some cases, a first element may be referred to as a second element without departing from the scope of the claims set forth herein. Similarly, a second element may also be referred to as a first element.

The term "an example embodiment" used herein does not refer to the same example embodiment, and is provided to emphasize a particular feature or characteristic different from that of another example embodiment. However, example embodiments provided herein are considered to be able to be preferred example embodiments of the present inventive concept, and will be described with reference to the accompanying drawings as follows.

Figure 1B:
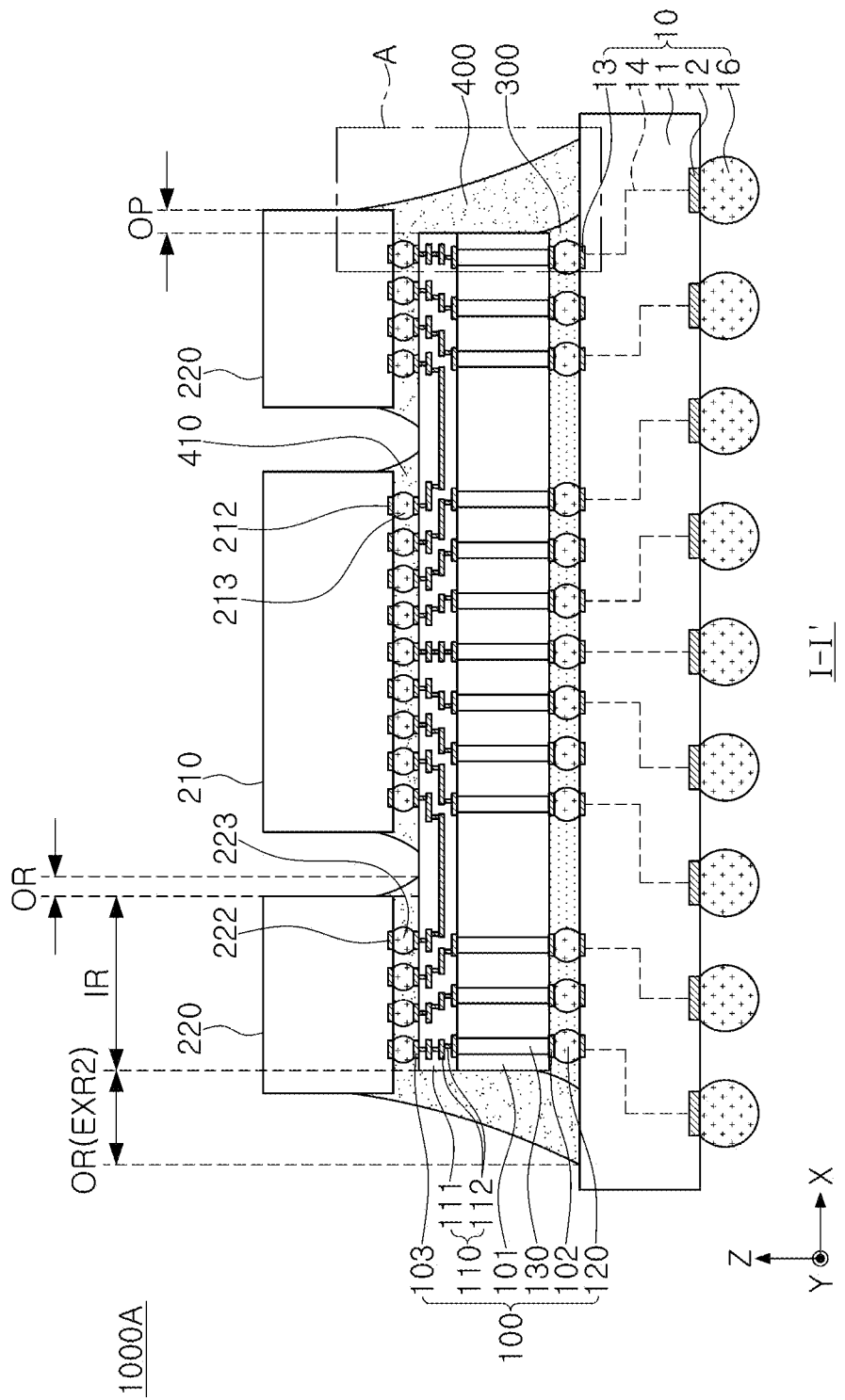
FIG. 1B is a cross-sectional view taken along line I-I' of FIG. 1A.
Figure 1C:
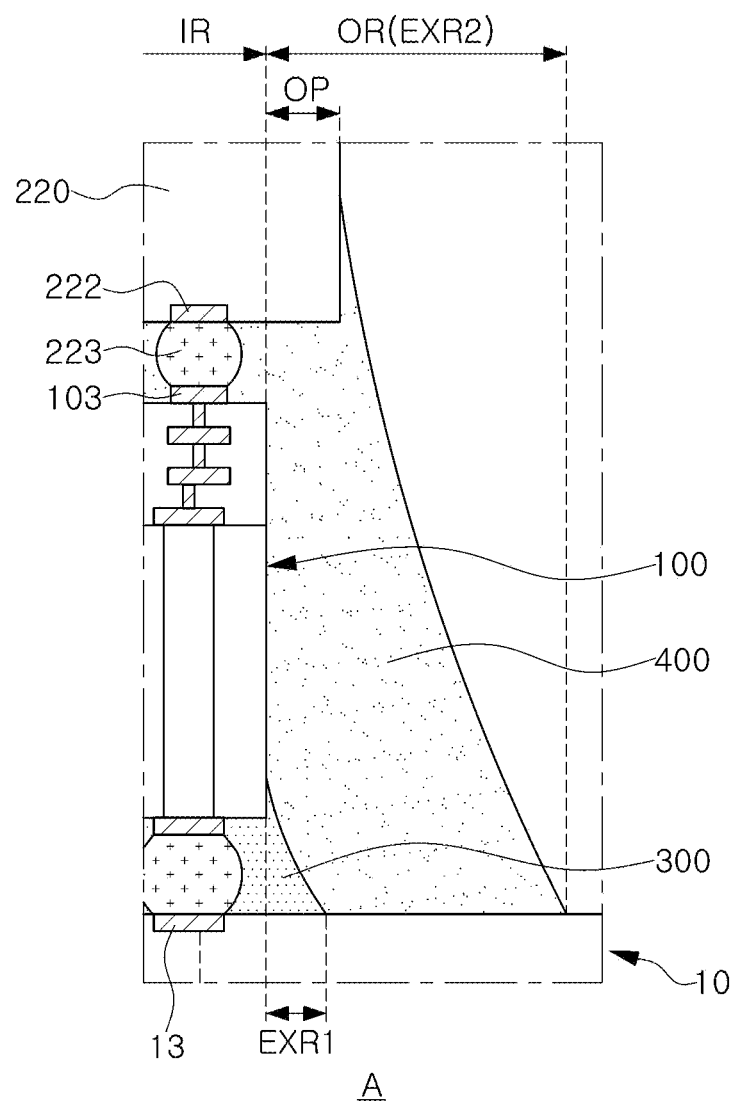
FIG. 1C is a partially enlarged view that illustrates area "A" of FIG. 1B.

FIGS. 1A to 1C are views that illustrate a semiconductor package 1000A according to an example embodiment of the present inventive concept. FIG. 1A is a plan view that illustrates a semiconductor package 1000A according to an example embodiment of the present inventive concept, FIG. 1B is a cross-sectional view taken along line I-I' of FIG. 1A, and FIG. 1C is a partially enlarged view that illustrates area "A" of FIG. 1B.

Referring to FIGS. 1A, 1B, and 1C, the semiconductor package 1000A may include a package substrate 10, an interposer 100, a first semiconductor chip 210, a second semiconductor chip 220, and a first underfill 300, and a second underfill 400.

The package substrate 10 may include a substrate body 11, pads 12 and 13 disposed on a lower surface and an upper surface of the substrate body 11, a first wiring structure 14 electrically connecting the pads 12 and 13, and a bump 16. The package substrate 10 is a support substrate on which the interposer 100 and the semiconductor chips 210 and 220 are mounted, and may be a substrate for a semiconductor package including a printed circuit board (PCB), a ceramic substrate, a glass substrate, a tape wiring board, and the like.

The substrate body 11 may include different materials depending on the type of the package substrate 10. For example, when the package substrate 10 is a printed circuit board, the substrate body 10 may be implemented as a copper clad laminate and/or in a form in which a wiring layer is additionally laminated on one or both surfaces of the copper clad laminate. A lower protective layer and an upper protective layer may be formed on a lower surface and an upper surface of the body, respectively. For example, a solder resist may be applied to the lower and upper protective layers.

The pads 12 and 13 include a lower pad 12 disposed on the lower surface of the substrate body 11 and an upper pad 13 disposed on the upper surface of the substrate body 11. The pads 12 and 13 and the first wiring structure 14 may form an electrical path connecting the lower surface and the upper surface of the package substrate 10. The pads 12 and 13 and the first wiring structure 14 may be formed of a metallic material, for example, and may include at least one metal among copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), and carbon (C) or an alloy including two or more metals thereof. The first wiring structure 14 may include single or multilayer wiring layers formed inside the substrate 10 and vias connecting them.

The bump 16 may connect the first wiring structure 14 to an external device, for example, a main board. The bump 16 may be in contact with the lower pad 12. The bump 16 may include a solder ball, and a conductive bump or a flip-chip connection structure having a grid array such as a pin grid array, a ball grid array, and/or a land grid array. The bump 16 may include a metallic material, for example, at least one metal among copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), and carbon (C), or an alloy including two or more metals thereof. For example, the bump 16 may include tin (Sn) or an alloy (e.g., Sn—Ag—Cu) including tin (Sn).

The interposer 100 may include a base substrate 101, interposer pads 102 and 103, a wiring region 110, an interposer bump 120, and a through-via 130. The interposer 100 may have a smaller planar area than the package substrate 10. For example, the interposer may have a smaller area on a horizontal surface, such as a surface parallel with an X-Y plan, than the package substrate 10.

The base substrate 101 may be disposed on the package substrate 10. The base substrate 101 may be a semiconductor wafer. The base substrate 101 may include, for example, a semiconductor element such as silicon or germanium (Ge), or a compound semiconductor such as silicon carbide (SiC), gallium arsenide (GaAs), indium arsenide (InAs), or indium phosphide (InP). A bottom surface or a rear surface of the base substrate 101 may be covered with an insulating film that includes a silicon oxide film, a silicon nitride film, or a combination thereof.

The interposer pads 102 and 103 may be disposed on a lower surface and an upper surface of the interposer 100. According to an example embodiment, the interposer pads 102 and 103 may be buried in the lower surface and the upper surface of the interposer 100. For example, the interposer pads 102 and 103 may be disposed in the interposer 100 such that only one surface of each pad is exposed. In this case, side surfaces of the interposer pads 102 and 103 may be surrounded by an insulating film made of a silicon oxide film, a silicon nitride film, or a combination thereof. The interposer pads 102 and 103 may include a metallic material, for example, at least one metal among copper (Cu), aluminum (Al), nickel (Ni), silver (Ag), gold (Au), platinum (Pt), or tin (Sn), lead (Pb), titanium (Ti), chromium (Cr), palladium (Pd), indium (In), zinc (Zn), and carbon (C) or an alloy containing two or more metals thereof.

The wiring region 110 may be disposed on the base substrate 101, and may include a second wiring structure 112 and an insulating layer 111 covering the second wiring structure 112. The insulating layer 111 may be disposed on an upper surface of the base substrate 101, and may include a silicon oxide and/or a silicon nitride. The second wiring structure 112 may interconnect a plurality of semiconductor chips 210 and 220, and/or may electrically connect the plurality of semiconductor chips 210 and 220 to the package substrate 10. The second wiring structure 112 may include one or more layers of metal wirings and contact vias. The contact vias may connect the metal wires to each other, and/or may connect the metal wires and the interposer upper pad 103. The second wiring structure 112 may electrically and physically connect the through-via 130 to the interposer upper pad 103.

The interposer bump 120 may contact with an interposer lower pad 102 on the lower surface of the interposer 100. The interposer bump 120 may mount the interposer 100 to the package substrate 10. The interposer bump 120 may connect a through-via 130 of the interposer 100 to the first wiring structure 14 of the package substrate 10. The interposer bump 120 may be smaller than the bump 16. Like the bump 16, the interposer bump 120 may include a metallic material, at least one metal among, for example, copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn) and carbon (C), or alloy containing two or more metals thereof.

The through-via 130 may be a through silicon via (TSV) penetrating through the base substrate 101 in a vertical direction (Z-direction). The through-via 130 may provide an electrical path connecting the interposer pads 101 and 102 on the lower surface and the upper surface of the interposer 100 together. The through-via 130 may electrically connect the second wiring structure 112 above the interposer 100 to the first wiring structure 14 of the package substrate 10. The through-via 130 may include a conductive plug and a barrier film surrounding the conductive plug. The conductive plug may include a metallic material, for example, tungsten (W), titanium (Ti), aluminum (Al), or copper (Cu). The conductive plug may be formed by a plating process, a PVD process, or a CVD process, or the like. The barrier film may include an insulating barrier film and/or a conductive barrier film. The insulating barrier film may be formed of an oxide film, a nitride film, a carbide film, a polymer, or a combination thereof. The conductive barrier film may be disposed between the insulating barrier film and the conductive plug. The conductive barrier layer may include, for example, a metal compound such as tungsten nitride (WN), titanium nitride (TiN), or tantalum nitride (TaN). The barrier film may be formed in a PVD process or a CVD process.

A plurality of semiconductor chips 210 and 220 may be mounted on the interposer 100 and connected to each other through the interposer 100. The plurality of semiconductor chips 210 and 220 may be electrically connected to each other through the wiring region 110 of the interposer 100 and/or the second wiring structure 112.

The plurality of semiconductor chips 210 and 220 may include semiconductor chip bumps 213 and 223 disposed on lower surfaces of the plurality of semiconductor chips 210 and 220. The semiconductor chip bumps 213 and 223 may connect the plurality of semiconductor chips 210 and 220 to the second wiring structure 112 of the interposer 100. Like the bump 16, the semiconductor chip bumps 213 and 223 may include a solder ball, and a conductive bump or a flip-chip connection structure having a grid array such as a pin grid array, a ball grid array, and/or a land grid array. In addition, the semiconductor chip bumps 213 and 223 may include a metallic material, for example, at least one metal among copper (Cu), aluminum (Al), nickel (Ni), silver (Ag), gold (Au), platinum (Pt), tin. (Sn), lead (Pb), titanium (Ti), chromium (Cr), palladium (Pd), indium (In), zinc (Zn), and carbon (C), or an alloy containing two or more metals thereof. The semiconductor chip bumps 213 and 223 may be smaller than the bump 16 and the interposer bump 120.

The plurality of semiconductor chips 210 and 220 may include semiconductor chip pads 212 and 222 contacting semiconductor chip bumps 213 and 223 on lower surfaces of the plurality of semiconductor chips 210 and 220. The semiconductor chip pads 212 and 222 may electrically connect the plurality of semiconductor chips 210 and 220 to the interposer 100.

The plurality of semiconductor chips 210 and 220 may include a first semiconductor chip 210 and a second semiconductor chip 220. The first semiconductor chip 210 may include a different type of integrated circuit than the second semiconductor chip 220, but the present disclosure is not necessarily limited thereto.

The first semiconductor chip 210 may include, for example, a central processor unit (CPU), a graphics processing unit (GPU), a field programmable gate array (FPGA), a digital signal processor (DSP), a cryptographic processor, microprocessor, a microcontroller, an analog-to-digital converter, and/or a logic chip such as application-specific ICs (ASICs).

The second semiconductor chip 220 may include a memory device. The memory device may include, for example, a volatile memory device such as dynamic RAM (DRAM), static RAM (SRAM), a non-volatile memory device such as phase change RAM (PRAM), magnetic RAM (MRAM), resistive RAM (RRAM), and a flash memory device, or a high-performance memory device such as a high bandwidth memory (HBM) or a hybrid memory cubic (HMC). For example, the second semiconductor chip 220 may include a semiconductor stack in which a plurality of semiconductor chips are stacked.

The first semiconductor chip 210 may overlap the interposer 100 in a Z-direction, for example, in a direction perpendicular to an upper surface of the interposer 100.

The second semiconductor chip 220 may include a region that overlaps the interposer 100 and a region that does not overlap the interposer 100 in a Z direction. The region of the second semiconductor chip 220 not overlapping the interposer 100 in the Z-direction may be referred to as an overhang portion OP. The overhang portion OP of the second semiconductor chip 220 may be a region of the second semiconductor chip 220 that protrudes from one side surface of the interposer 100. The overhang portion OP of the second semiconductor chip 220 may protrude from the interposer 100 in a direction parallel to an upper surface of the interposer 100 (e.g., X direction).

The overhang portion OP may have an overhang length between the one side surface of the interposer 100 and one side surface protruding from the overhang portion OP (e.g., in plan view). The overhang length may range from about 3 mm to about 4 mm.

In an example embodiment, there may be multiple second semiconductor chips 220. A portion of the plurality of second semiconductor chips 220-1 (e.g., in an embodiment, two semiconductor chips 220-1) may protrude from a first side S1 of the interposer 100 to have an overhang portion OP1, and a remaining portion 220-2 (e.g., in an embodiment, two semiconductor chips 220-2) of the second semiconductor chips may protrude from a second side S2 opposite to the first side S1 to have an overhang portion OP2. That is, the overhang portions OP1 and OP2 of the plurality of second semiconductor chips 220-1 and 220-2 may protrude in opposite directions from each other, and may protrude from the two opposing parallel sides S1 and S2 of the interposer 100, respectively. The portion 220-1 of the plurality of second semiconductor chips and the remaining portion 220-2 of the plurality of second semiconductor chips may each include multiple semiconductor chips.

In an example embodiment, each of the plurality of second semiconductor chips 220-1 and 220-2 may include a first region in which a semiconductor chip pad 222 electrically connecting the second semiconductor chip 220 to the interposer 100 is disposed, and a second region surrounding the first region. In an example, the second region may be referred to as a margin region. The overhang portion OP may be located in a portion of the second region. That is, the overhang portion OP may be a portion of the margin region.

As the second semiconductor chip 220 includes the overhang portion OP, a size of the interposer may be reduced. For example, when the second semiconductor chip 220 is mounted on the interposer that is lesser in size by the overhang portion OP, the size of the interposer may be reduced within a range of about 20% to about 30% compared to the related art. Accordingly, a production yield of the interposer 100 or the semiconductor package may be increased. In addition, as the size of the interposer is reduced, a warpage phenomenon of the semiconductor package may be suppressed. For example, the semiconductor package according to the present disclosure may be manufactured with decreased instances of warpage.

The first underfill 300 may cover a lower surface of the interposer 100. The first underfill 300 may fix the interposer 100 to be mounted on the package substrate 10. For example, the first underfill 300 may hold the interposer 100 in place on the package substrate 10 during a manufacturing process.

Referring to FIG. 1C, the first underfill 300 may be disposed between the package substrate 10 and the interposer 100, and include a first extension portion EXR1 extending from a side surface of the interposer 100. The first extension portion EXR1 may be a region that does not overlap the interposer 100 in a Z direction. The first extension portion EXR1 may cover at least a portion of a lower end of a side surface of the interposer 100, and extend to an upper surface of the package substrate 10. A width of the first extension portion EXR1 may increase toward the package substrate 10 (e.g., the width may increase in the −Z-direction, and reach a maximum at the boundary between the first extension portion EXR1 of the first underfill 300 and the package substrate 10).

The first underfill 300 may include an insulating polymer material, for example, an epoxy resin.

In a thermal cycle (TC) test of the semiconductor package 1000A, a crack may occur in a corner portion or an edge portion of the first extension portion EXR1. For example, a crack may occur in the first extension portion EXR1 adjacent to the edge of the interposer 100. The second underfill 400 may prevent delamination of the interface between the interposer 100 and the package substrate 10 due to the crack.

The second underfill 400 may cover a lower surface of the second semiconductor chip 220. The second underfill 400 may be mounted on the interposer 100.

Referring to FIGS. 1B and 1C, the second underfill 400 may include an inner portion IR which overlaps both the interposer 100 and the second semiconductor chip 220 in a Z direction and an outer portion surrounding the inner portion IR. The second underfill 400 may further include an outer portion OR, and the outer portion OR may include a second extension portion EXR2 which extends toward an upper surface of the package substrate 10 along at least a portion of the first extension portion EXR1 of the first underfill 300.

The second extension portion EXR2 may cover at least a portion of a side surface and a lower surface of the overhang portion OP of the second semiconductor chip 220. The second extension portion EXR2 may extend to the package substrate 10 while covering at least a portion of the side surface of the interposer 100 and the first underfill 300. The second extension portion EXR2 may contact an upper surface of the package substrate 10. A width of the second extension portion EXR2 may increase toward the upper surface of the package substrate 10 (e.g., the width may increase in the −Z-direction, and reach a maximum at the boundary between the second extension portion EXR2 of the second underfill 400 and the package substrate 10).

The second extension portion EXR2 may protrude from the overhang portion OP and contact the upper surface of the package substrate 10 (e.g., in plan view). Among the second extension portions EXR2, a portion protruding from the overhang portion OP may be referred to as a fillet. In plan view, a width between the overhang portion OP of the second semiconductor chip 220 and the second underfill 400, i.e., a fillet length, may be in a range of about 0.1 mm to about 0.5 mm. For example, a width of the second underfill 400 between its widest point which contacts the package substrate 10 and the overhang portion OP of the second semiconductor chip 220 may be about 0.1 mm to about 0.5 mm.

The second underfill 400 may include an insulating polymer material, for example, an epoxy resin. In one example embodiment, the second underfill 400 and the first underfill 300 may include different materials. The first underfill 300 and the second underfill 400 may have, for example, a difference in modulus of about a factor of 0.1 to about a factor of about 2. In another example embodiment, the second underfill 400 may include the same material as the first underfill 300. Meanwhile, in the present specification, "different materials" may be understood to include materials having different compositions as well as materials having different physical properties.

The second underfill 400 may contact the first underfill 300. The first underfill 300 and the second underfill 400 may be distinguished from each other (for example, the first underfill 300 and the second underfill 400 may include different materials, and may have a boundary between each other). Each of the first and second underfills 300 and 400 may be a single layer.

As the second underfill 400 connects the second semiconductor chip 220 and the package substrate 10, delamination of the interface between the interposer 100 and the package substrate 10 may be prevented. Stress may not be concentrated in an edge region of the first underfill 300 where the first underfill 300 contacts the package substrate 10, and stress may dissipate in a region of the second underfill 400 where the second underfill 400 contacts the package substrate 10. Accordingly, cracks in the edge region of the first underfill 300 may be prevented.

The semiconductor package 1000A according to an example embodiment may further include a third underfill 410. The third underfill 410 may cover a lower surface of the first semiconductor chip 210. The third underfill 410 may fix the first semiconductor chip 210 to be mounted on the interposer 100. For example, the third underfill 410 may hold the first semiconductor chip on the interposer 100 during a manufacturing process. The third underfill 410 may be disposed on the interposer 100 between the interposer 100 and the first semiconductor chip 210.

The third underfill 410 may include an insulating polymer material, for example, an epoxy resin. In one example embodiment, the third underfill 410 may include the same material as the second underfill 400, and may include a material different from that of the first underfill 300. In another example embodiment, the third underfill 410 may include a material different from that of the second underfill 400.

Referring to FIGS. 1A to 1C, it is illustrated that the first semiconductor chip 210 and the second semiconductor chip 220 are mounted on the interposer 100. In another embodiment, unlike the embodiment(s) of FIGS. 1A to 1C, a single chip may be mounted on the interposer 100. The single chip may refer to a second semiconductor chip 220.

Figure 2:
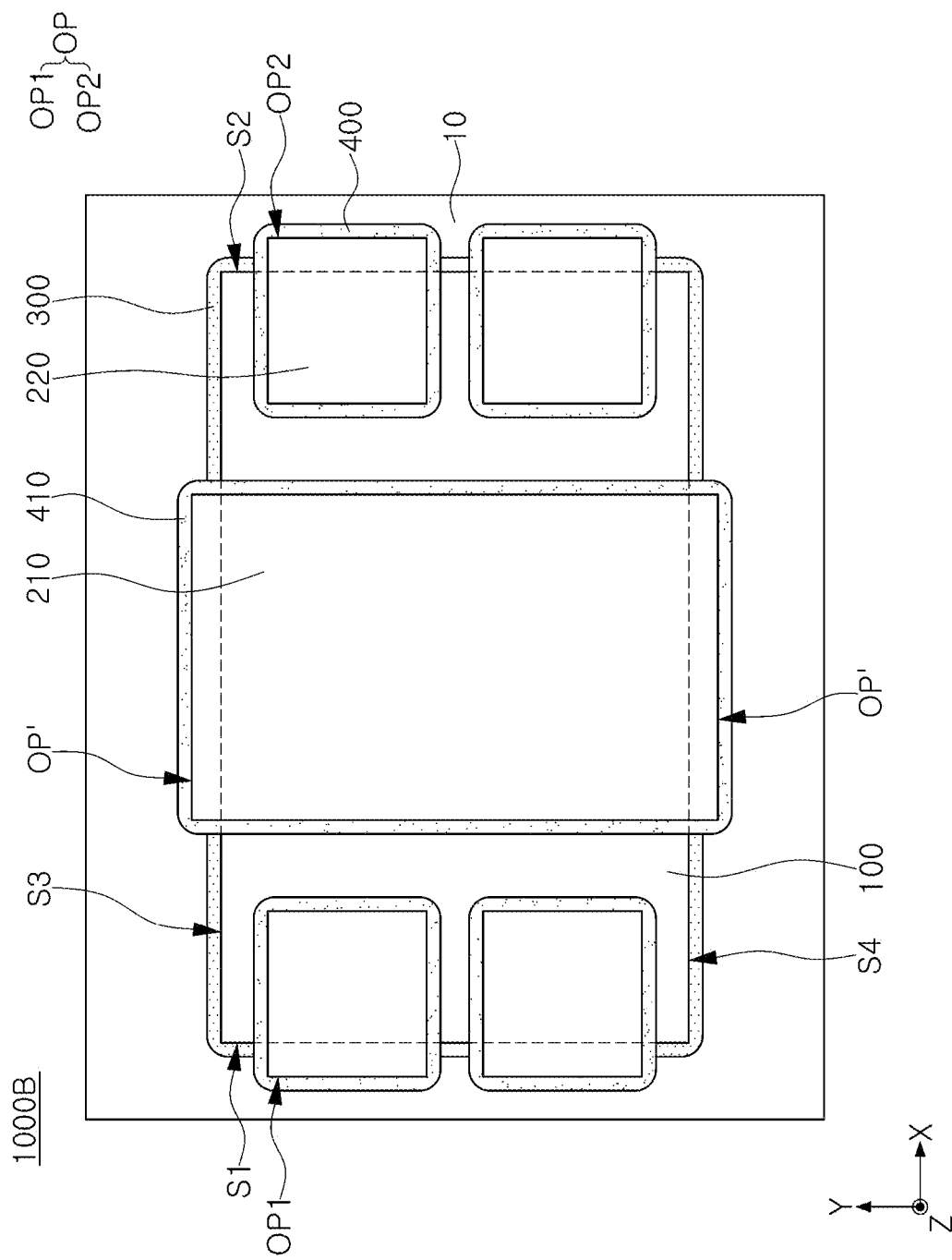
FIG. 2 is a cross-sectional view that illustrates a semiconductor package according to an example embodiment of the present inventive concept.

FIG. 2 is a cross-sectional view that illustrates a semiconductor package 1000B according to an example embodiment of the present inventive concept.

Referring to FIG. 2, the semiconductor package 1000B may include a structure of a first semiconductor chip 210, a third underfill 410, and an interposer 100 different from those of FIGS. 1A to 1C. For example, in this embodiment, a first semiconductor chip 210 may include an overhang portion OP'.

The first semiconductor chip 210 may be mounted on the interposer 100, and may be connected to the second semiconductor chip 220 through the interposer 100. The first semiconductor chip 210 may include a region not overlapping the interposer 100 in a Z direction. That is, the first semiconductor chip 210 may include the overhang portion OP' which protrudes from the interposer 100.

In an example embodiment, as described with reference to FIG. 1, a plurality of second semiconductor chips 220-1 and 220-2 may protrude from a first side S1 and a second side S2 of the interposer 100 and have overhang portions OP1 and OP2. In an example, such as the example illustrated in FIG. 2, the first semiconductor chip 210 may protrude from sides S3 and S4 each perpendicular to the first side S1 and the second side S2 of the interposer 100 to have an overhang portion OP'. For example, the first semiconductor chip 210 may include an overhang portion OP' distinguished from other portions of the first semiconductor chip 210 by protruding from two sides of the interposer 100. In another example, the first semiconductor chip 210 may protrude from one of the sides S3 and S4 perpendicular to the first side S1 and the second side S2.

A third underfill 410 may cover a lower surface of the first semiconductor chip 210, and fix the first semiconductor chip 210 to be mounted on the interposer 100. The third underfill 410 may include an insulating polymer material, for example, an epoxy resin. The third underfill 410 may include a material that is the same as the second underfill 400, and/or may include a material that is different from that of the first underfill 300. The third underfill 410 may be disposed between the interposer 100 and the first semiconductor chip 210, and may include a third extension portion which extends to an upper surface of the package substrate 10 along at least a portion of a first extension portion EXR1 of the first underfill 300 (see FIG. 1C).

The third extension portion may cover at least a portion of a side surface and a lower surface of the overhang portion OP' of the first semiconductor chip 210. The third extension portion may extend to the package substrate 10 while covering at least a portion of a side surface of the interposer 100 and the first underfill 300. Accordingly, the third extension portion may contact an upper surface of the package substrate 10. A width of the third extension portion may increase toward the upper surface of the package substrate 10 (e.g., the width may increase in the −Z-direction, and reach a maximum at the boundary between the third extension portion of the third underfill 410 and the package substrate 10). In a plan view, the third extension portion may protrude from the overhang portion OP' and contact the upper surface of the package substrate 10. A portion in which the third extension portion protrudes from the overhang portion OP' may be referred to as a fillet. In a plan view, a width between the overhang portion OP' of the first semiconductor chip 210 and the third underfill 410 may be in a range of about 0.1 mm to about 0.5 mm. For example, a width of the third underfill 410 between its widest point which contacts the package substrate 10 and the overhang portion OP' of the first semiconductor chip 210 may be about 0.1 mm to about 0.5 mm.

As the first semiconductor chip 210 includes the overhang portion OP', and the second semiconductor chip 220 includes the overhang portion OP (e.g., including overhang portions OP1 and OP2), the size of the interposer 100 may be reduced. Accordingly, the production yield of the semiconductor package may be increased.

Figure 3:
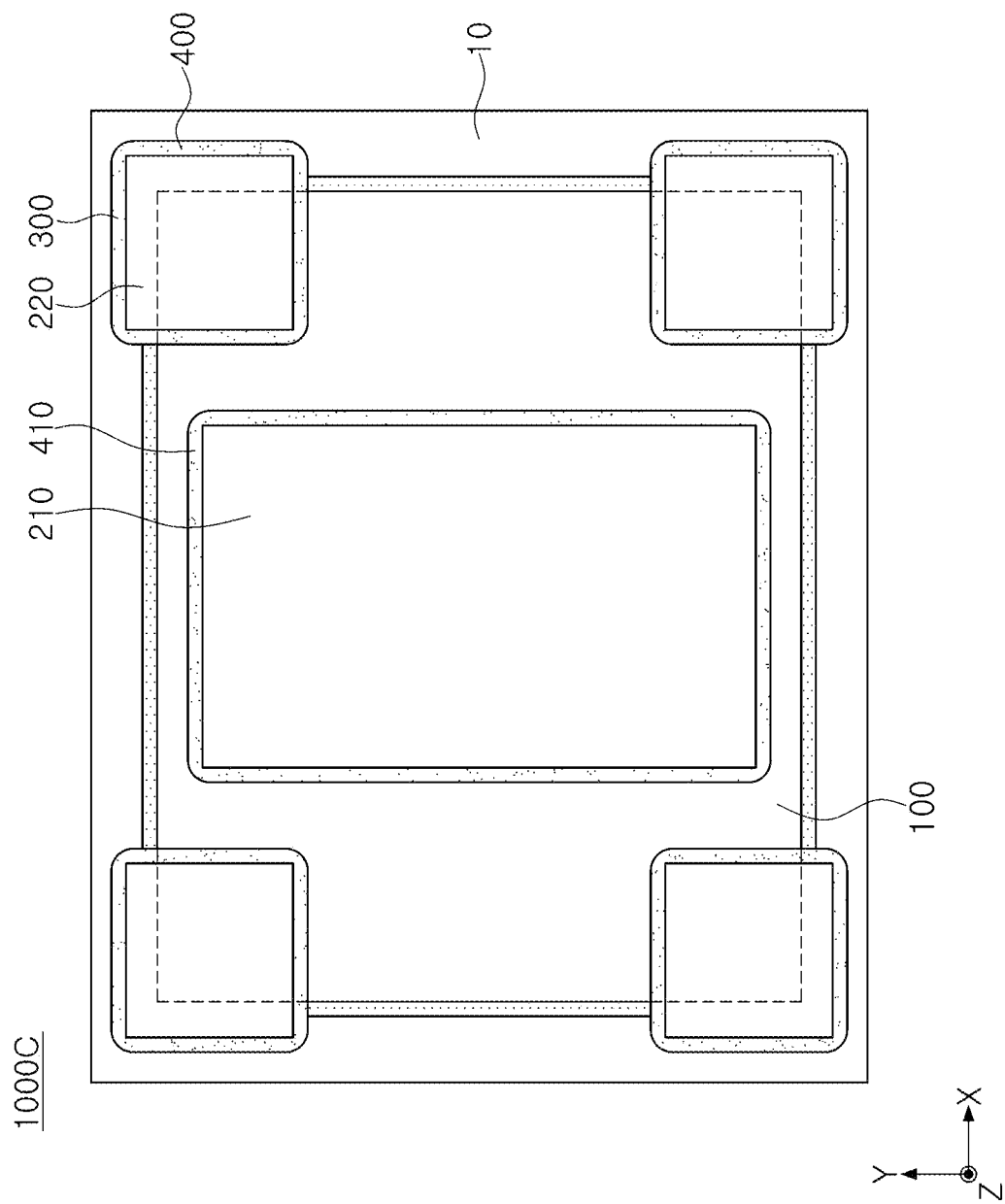
FIG. 3 is a cross-sectional view that illustrates a semiconductor package according to an example embodiment of the present inventive concept.

FIG. 3 is a cross-sectional view that illustrates a semiconductor package 1000C according to an example embodiment of the present inventive concept.

Referring to FIG. 3, the position(s) of second semiconductor chip(s) 210 in the semiconductor package 1000C and a structure of a second underfill 400 may be different from those of FIGS. 1A to 1C.

The second semiconductor chip 210 may include a region that overlaps the interposer 100 and a region that does not overlap the interposer 100 in a Z direction. An overhang portion OP, the non-overlapping region, may protrude from a corner or an edge of the interposer 10.

For example, unlike the embodiment of FIG. 1, the overhang portion OP may protrude from a corner of the interposer 100 rather than protrude from one side surface of the interposer 100. Accordingly, the overhang portion OP of the second semiconductor chip 220 may have a bent rectangular shape in a plan view. However, the shape of the overhang portion OP is not necessarily limited thereto.

In an example embodiment, the number of second semiconductor chips 220 may be provided in plural. At least a portion of the plurality of second semiconductor chips 220 may protrude from an edge of the interposer 100. Accordingly, the second semiconductor chips 220 may overlap the edge of the interposer 100 in a Z-axis direction.

As the second semiconductor chip 220 includes the overhang portion OP, the size of the interposer 100 may be reduced to increase a production yield of the semiconductor package. As the second semiconductor chip 220 overlaps the edge of the interposer, stress applied to the edge region of the first underfill 300 may be dissipated. Accordingly, a warpage phenomenon of the semiconductor package may be increased, and reliability thereof may be increased.

Figure 4:
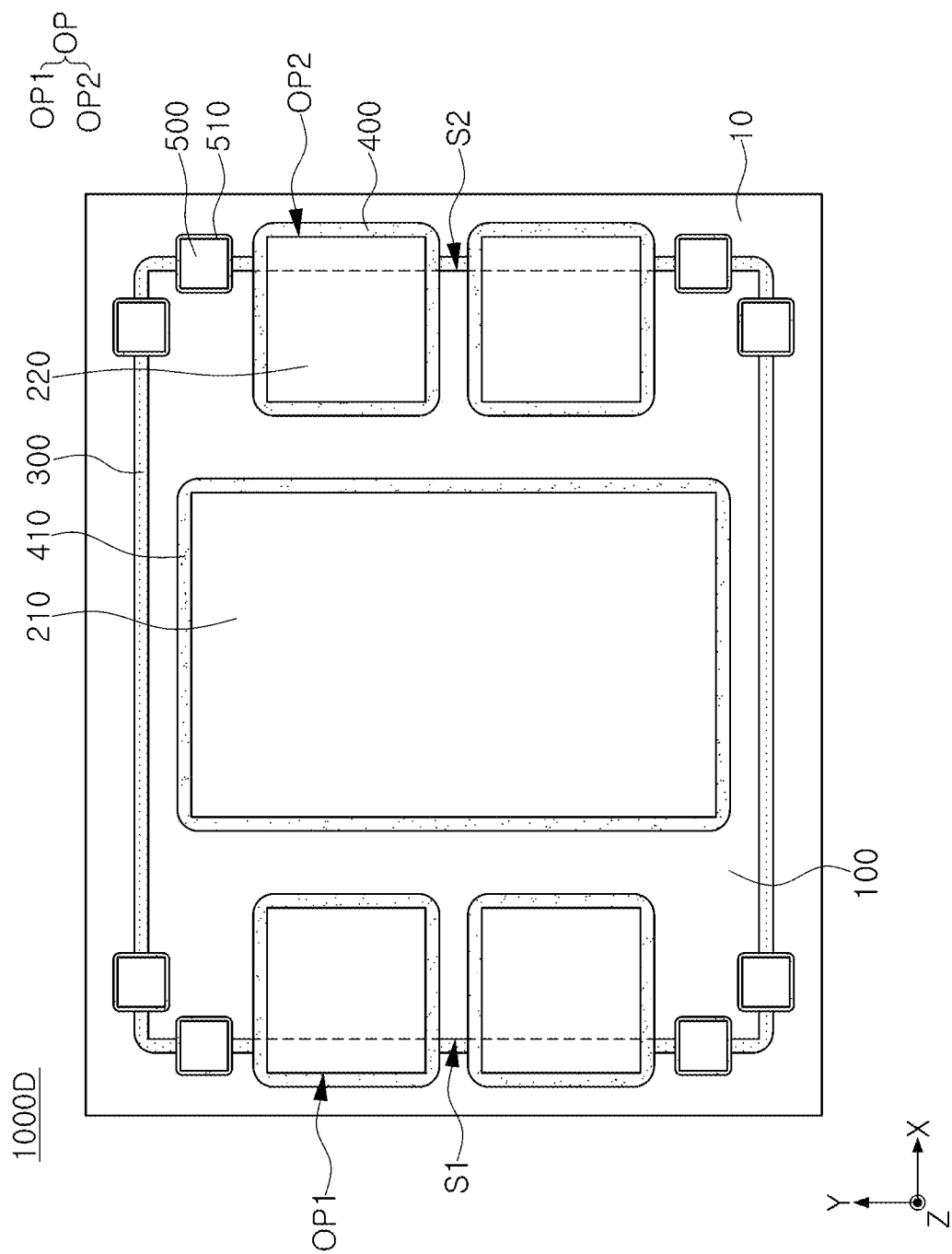
FIG. 4 is a cross-sectional view that illustrates a semiconductor package according to an example embodiment of the present inventive concept.

FIG. 4 is a cross-sectional view that illustrates a semiconductor package 1000D according to an example embodiment of the present inventive concept.

Referring to FIG. 4, the semiconductor package 1000D may further include a dummy chip 500 and a dummy chip underfill 510 in the semiconductor package 1000A of FIGS. 1A to 1C.

The dummy chip 500 may be mounted on the interposer 100. The dummy chip 500 may include silicon (Si). The dummy chip 500 may be electrically insulated from the interposer 100. The dummy chip 500 may have a size smaller than those of the first semiconductor chip 210 and the second semiconductor chip 220.

The dummy chip 500 may include an overhang portion not overlapping the interposer 100 in a Z direction.

The dummy chip 500 may be disposed in a region adjacent to an edge of the interposer 100, but is not necessarily limited thereto. The dummy chip 500 may be provided as a plurality of dummy chips 500. The number and positions of the dummy chips 500 shown in FIG. 4 are for illustrative purposes only, and are not necessarily limited thereto.

The dummy chip underfill 510 may be disposed between the dummy chip 500 and the interposer 100. The dummy chip underfill 510 may cover a lower surface of the dummy chip 500. At least a portion of the dummy chip underfill 510 may extend to an upper surface of the package substrate 10 along a side surface of the interposer 100 and a first extension portion EXR1 (refer to FIG. 1). The dummy chip underfill 510 may include an insulating polymer material, for example, an epoxy resin. In an example embodiment, the dummy chip underfill 510 may include the same material as the second underfill 400, and may include a different material from the first underfill 300. However, according to an example embodiment, the dummy chip underfill 510 may include a material different from that of the second underfill 400.

Similar to the second underfill 400, the dummy chip 500 and the dummy chip underfill 510 may dissipate stress applied to the first underfill 300 to prevent warpage, and a semiconductor package having increased reliability may be provided.

Figure 5A:
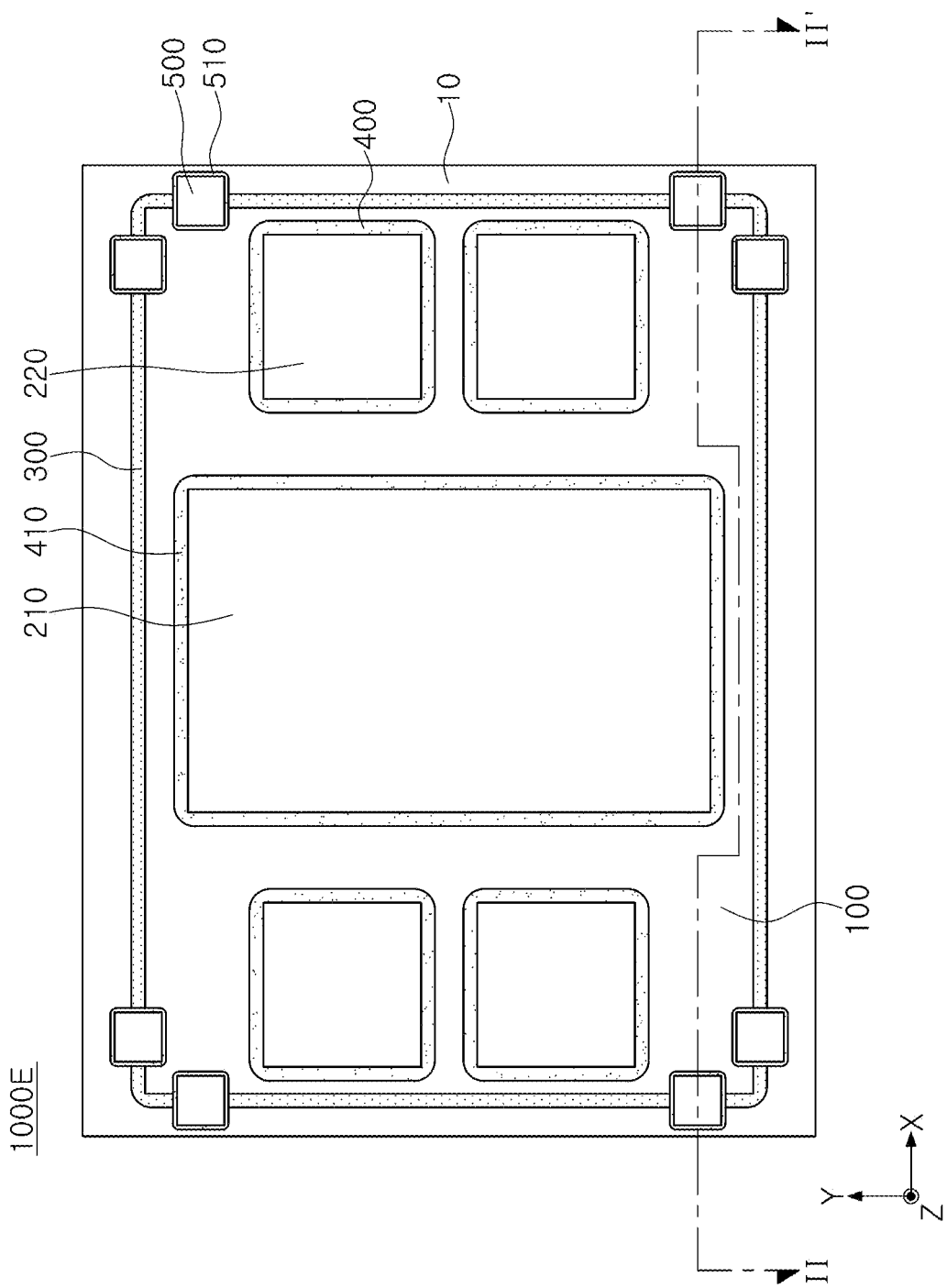
FIG. 5A is a plan view that illustrates a semiconductor package according to an example embodiment of the present inventive concept.
Figure 5B:
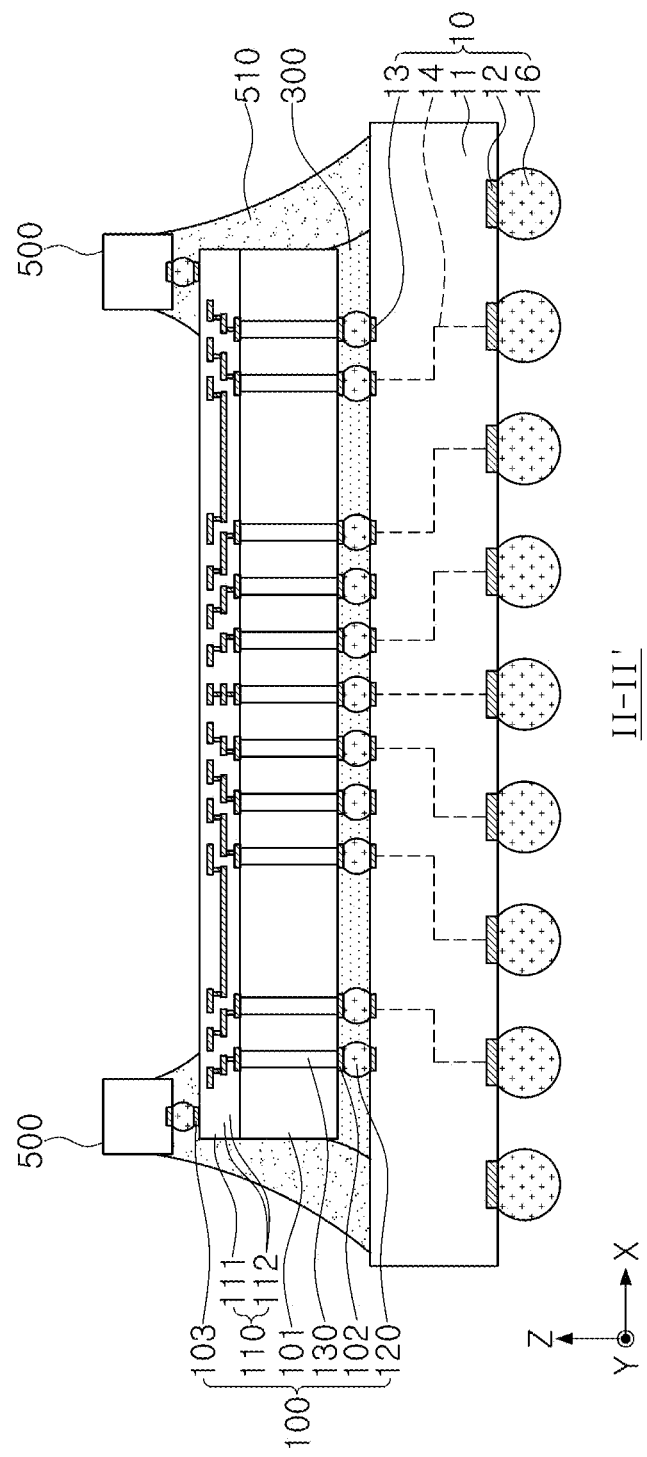
FIG. 5B is a cross-sectional view taken along line I-I' of FIG. 5A.

FIG. 5A is a plan view that illustrates a semiconductor package 1000E according to an example embodiment of the present inventive concept, and FIG. 5B is a cross-sectional view taken along line I-I' of FIG. 5A.

Referring to FIGS. 5A and 5B, the semiconductor package 1000E may include the dummy chip 500 and the dummy chip underfill 510, the same as described with reference to FIG. 4.

The semiconductor package 1000E according to an example embodiment may include a structure of the second semiconductor chip 220 and the second underfill 400 that is different from those of FIG. 4. The second semiconductor chip 220 may be disposed on the interposer 100, and may wholly overlap the interposer 100 in a Z-axis direction. For example, unlike FIG. 4, the second semiconductor chip 220 in this embodiment might not include an overhang portion OP.

The second underfill 400 may cover a lower surface of the second semiconductor chip 220, and may be disposed between the interposer 100 and the second semiconductor chip 220. The second underfill 400 may include an inner portion overlapping the interposer 100 and an outer portion surrounding the inner portion. The outer portion may be in contact with the interposer 100. Unlike FIG. 4, the outer portion might not include a portion in contact with the package substrate 10.

Figure 6:
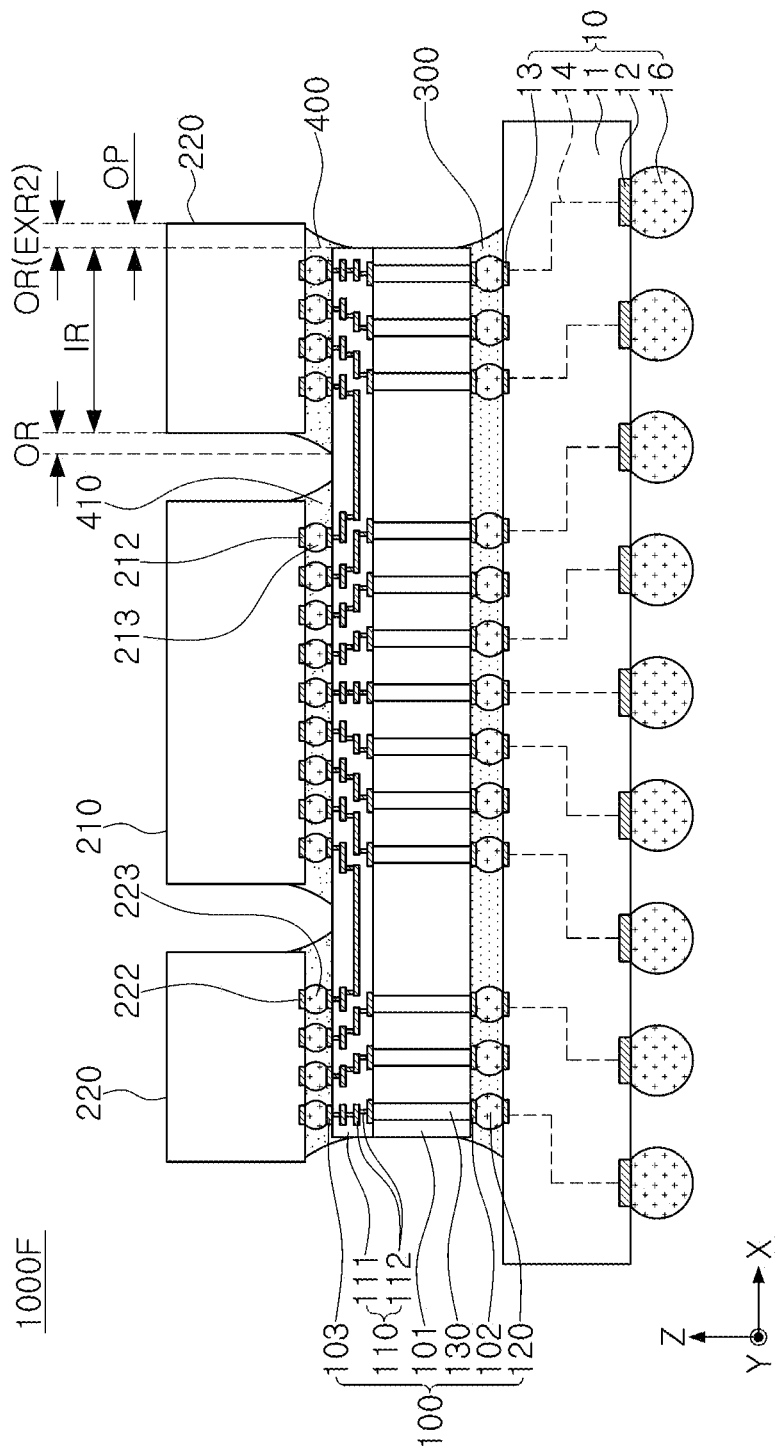
FIG. 6 is a cross-sectional view that illustrates a semiconductor package according to an example embodiment of the present inventive concept.

FIG. 6 is a cross-sectional view that illustrates a semiconductor package 1000F according to an example embodiment of the present inventive concept.

Referring to FIG. 6, the semiconductor package 1000F may include a second underfill 400 that is different from that of FIG. 1.

The second underfill 400 may be disposed between an interposer 100 and a second semiconductor chip 220. The second underfill 400 may cover a portion of a lower surface of the second semiconductor chip 220. The second underfill 400 might not cover a portion of a lower surface of the overhang portion OP of the second semiconductor chip 220. The second underfill 400 might not cover a lower end portion of the side surface of the second semiconductor chip 220.

The second underfill 400 may include an inner portion IR which overlaps both the interposer 100 and the second semiconductor chip 220 in a Z direction, and an outer portion OR surrounding the inner portion IR. The outer portion OR may include a second extension portion EXR2 at least partially covering a lower surface of the overhang portion OP of the second semiconductor chip 220.

The second extension portion EXR2 may cover an upper end portion of a side surface of the interposer 100. Unlike FIG. 1, the second extension portion EXR2 might not extend to the first underfill 300 and the package substrate 10. Accordingly, the second extension portion EXR2 might not contact the first underfill 300 and the package substrate 10.

Figure 7A:
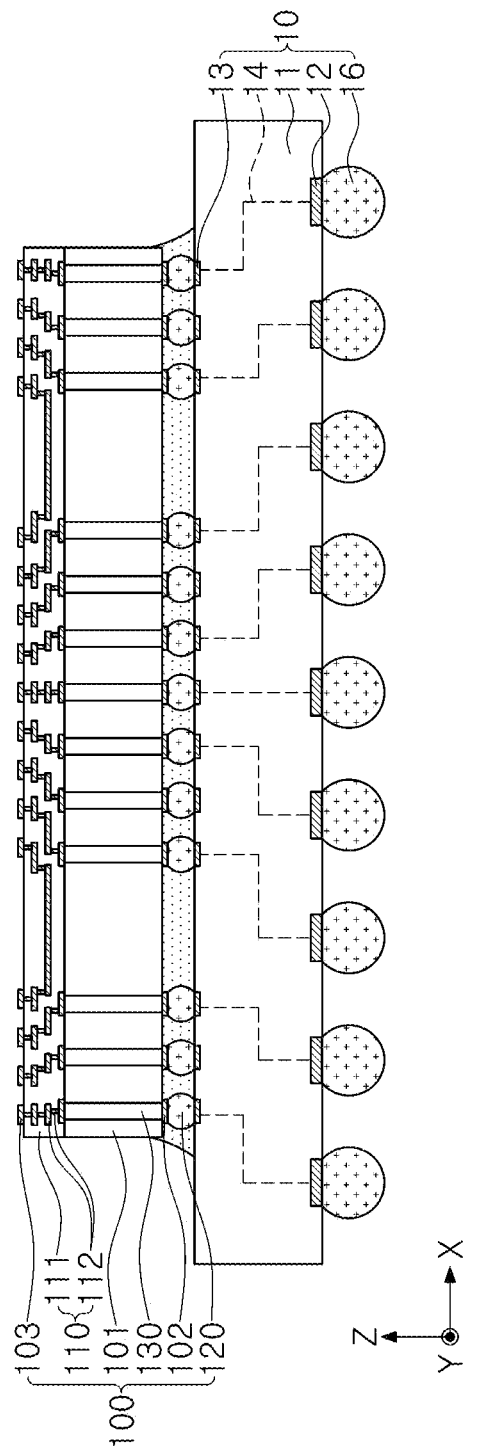
FIGS. 7A to 7B are cross-sectional views that schematically illustrate a manufacturing method for the semiconductor package of FIGS. 1A to 1C.
Figure 7B:
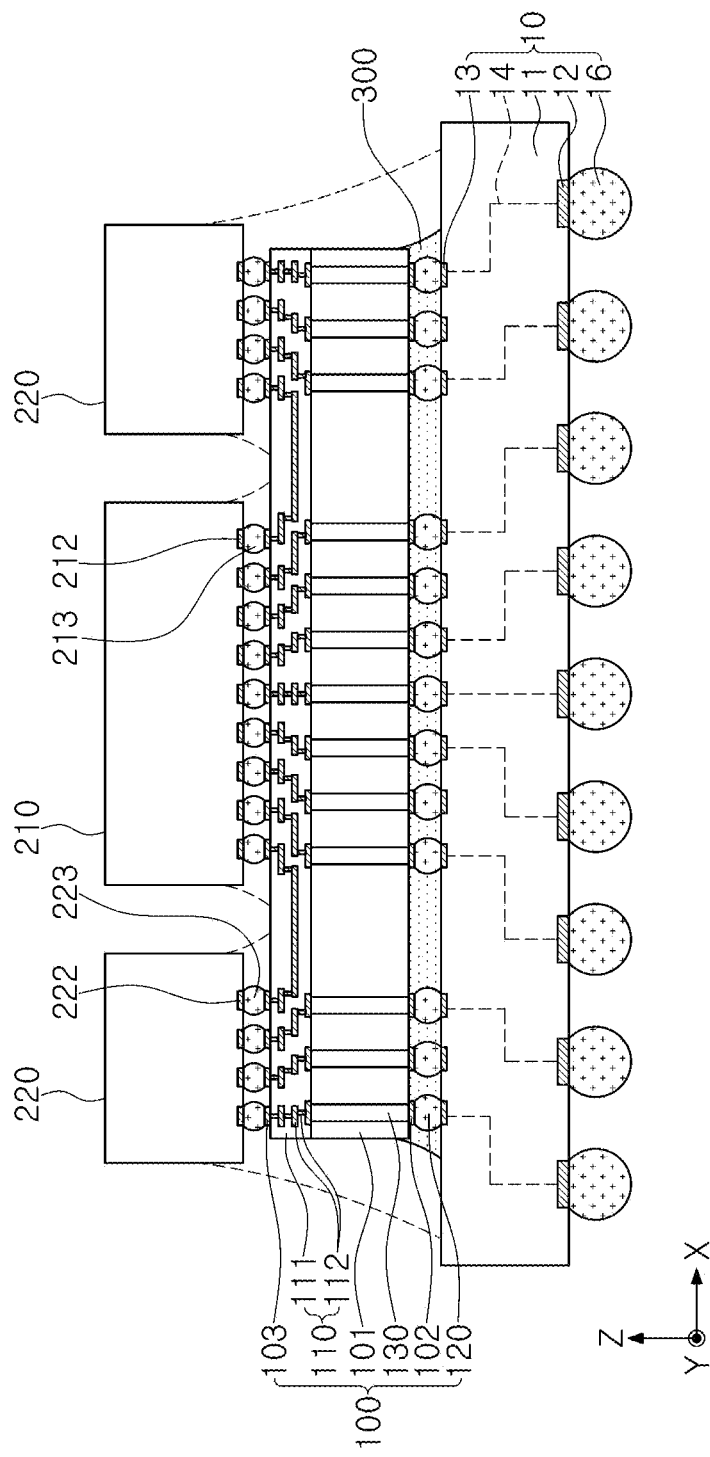

FIGS. 7A to 7B are cross-sectional views that schematically illustrate a manufacturing method of the semiconductor package 1000A of FIGS. 1A to 1C.

Referring to FIG. 7A, an interposer 100 may be formed on a package substrate 10. The interposer 100 may be mounted by contacting an interposer bump 120 with an upper pad 13 through a reflow process, or the like.

A first underfill 300 may be formed between the package substrate 10 and the interposer 100. The first underfill 300 may be formed to cover a lower surface of the interposer 100 and side surfaces of the interposer bump 120. The first underfill 300 may be formed by filling an underfill solution between the interposer 100 and the package substrate 10 and curing the underfill solution.

Referring to FIG. 7B, a first semiconductor chip 210 and a second semiconductor chip 220 may be formed on the interposer 100. The first semiconductor chip 210 and the second semiconductor chip 220 may be mounted by contacting semiconductor chip bumps 213 and 223 to an interposer upper pad 103 (e.g., to a plurality of interposer upper pads 103) through a reflow process, or the like.

A third underfill 410 (see FIG. 1) filling a space between the first semiconductor chip 210 and the interposer 100 and a second underfill 400 filling a space between the second semiconductor chip 220 and the interposer 100 (see FIG. 1) may be formed.

As set forth above, example embodiments of the present inventive concept provide a semiconductor package having increased a production yield and reliability, by providing a semiconductor chip including an overhang portion and an underfill extending from the semiconductor chip to a package substrate on an interposer, implemented by being combined in whole or in part one with one another. For example, one element described in a particular example embodiment, even if it is not described in another example embodiment, may be understood as a description related to another example embodiment, unless an opposite or contradictory description is provided therein.

Terms used herein are used only in order to describe an example embodiment rather than limiting the present disclosure. In this case, singular forms include plural forms unless interpreted otherwise in context.

While example embodiments have been shown and described above, it will be apparent to those skilled in the art that modifications and variations may be made without departing from the scope of the present inventive concept as defined by the appended claims.

What is claimed is:

1. A semiconductor package, comprising:
a package substrate;
an interposer disposed on the package substrate;
a first semiconductor chip mounted on the interposer;
a second semiconductor chip mounted on the interposer adjacent to the first semiconductor chip, wherein the second semiconductor chip includes an overhang portion that does not overlap the interposer in a direction perpendicular to an upper surface of the interposer;
a first underfill disposed between the package substrate and the interposer, the first underfill having a first extension portion extending from a side surface of the interposer;
a second underfill disposed between the interposer and the second semiconductor chip, the second underfill having a second extension portion extending to an upper surface of the package substrate along at least a portion of the first extension portion of the first underfill,
wherein the second extension portion covers at least a portion of a side surface of the overhang portion and protrudes from the overhang portion to contact the upper surface of the package substrate.

2. The semiconductor package of claim 1, wherein the second underfill including the second extension portion completely covers a lower surface of the overhang portion of the second semiconductor chip.

3. The semiconductor package of claim 1, wherein a width of the second extension portion increases from the second semiconductor chip toward the upper surface of the package substrate.

4. The semiconductor package of claim 1, wherein, in a plan view, a width between the overhang portion of the second semiconductor chip and the second underfill is about 0.1 mm to about 0.5 mm.

5. The semiconductor package of claim 1, wherein the second underfill contacts at least a portion of the first underfill.

6. The semiconductor package of claim 1, wherein the first underfill and the second underfill comprise different materials.

7. The semiconductor package of claim 6, wherein the first underfill and the second underfill differ in a modulus property by a factor of about 0.1 times to about 2.

8. The semiconductor package of claim 1, wherein the overhang portion protrudes from one side surface of the interposer in a plan view, and
wherein an overhang length between the one side surface of the interposer and the one protruding side surface of the overhang portion is about 3 mm to about 4 mm in the plan view.

9. The semiconductor package of claim 1, wherein the second semiconductor chip comprises a semiconductor stack in which a plurality of semiconductor chips are stacked.

10. The semiconductor package of claim 9, wherein the second semiconductor chip is provided in plural,
wherein a portion of the plurality of second semiconductor chips protrude from a first side of the interposer to form the overhang portion, and
wherein a remaining portion of the plurality of second semiconductor chips protrudes from a second side opposite to the first side of the interposer to form the overhang portion.

11. The semiconductor package of claim 10, wherein the first semiconductor chip has an overhang portion that does not overlap the interposer in the direction perpendicular to the upper surface of the interposer, and
wherein the semiconductor package further includes a third underfill disposed between the interposer and the first semiconductor chip, and wherein the third underfill includes a third extension portion extending to an upper surface of the package substrate along at least a portion of the first extension portion of the first underfill.

12. The semiconductor package of claim 9, wherein the second semiconductor chips is provided in plural, and
wherein overhang portions of some of the plurality of second semiconductor chips protrude from an edge of the interposer.

13. The semiconductor package of claim 1, further comprising:
a dummy chip electrically insulated from the interposer and disposed thereon, the dummy chip including an overhang portion that does not overlap the interposer; and
a dummy chip underfill disposed between the dummy chip and the interposer,
wherein at least a portion of the dummy chip underfill extends to the upper surface of the package substrate along the side surface of the interposer and along at least a portion of the first extension portion.

14. The semiconductor package of claim 1, wherein the interposer comprises a wiring region electrically connecting the first semiconductor chip and the second semiconductor chip.

15. A semiconductor package, comprising:
a package substrate;
an interposer disposed on the package substrate;
a first semiconductor chip mounted on the interposer;
a plurality of second semiconductor chips mounted on the interposer and spaced apart from the first semiconductor chip, the plurality of second semiconductor chips having an overhang portion protruding from the interposer in a direction that is parallel to an upper surface of the interposer;
a first underfill covering a lower surface of the interposer, the first underfill including a first extension portion extending along the package substrate, wherein the first extension portion does not overlap the interposer in a direction that is perpendicular to the upper surface of the interposer; and
a second underfill covering a lower surface of each of the plurality of second chips, the second underfill having a second extension portion extending along at least a portion of the first extension portion of the first underfill to contact an upper surface of the package substrate, wherein the second underfill completely covers a lower surface of the overhang portion of each of the plurality of second chips,
wherein the first and second semiconductor chips are electrically connected through the interposer,
wherein a portion of the plurality of second semiconductor chips protrude from a first side of the interposer,
wherein a remaining portion of the plurality of second semiconductor chips protrude from a second side opposite to the first side of the interposer, and
wherein the protrusions of the portion and of the remaining portion of the plurality of second semiconductor chips form the overhang portion.

16. The semiconductor package of claim 15, wherein in a plan view, the second extension portion protrudes from the overhang portion, and wherein the second extension portion contacts the upper surface of the package substrate.

17. The semiconductor package of claim 16, wherein the second extension portion covers at least a portion of a side surface of the interposer, and further covers a lower end portion of a side surface of the overhang portion of each of the plurality of second semiconductor chips.

18. The semiconductor package of claim 15, wherein the first underfill contacts the second underfill, and
wherein the first underfill and the second underfill are single layers, and wherein the first underfill includes a different material from the second underfill.

19. The semiconductor package of claim 15, wherein each of the plurality of second semiconductor chips includes a first region in which chip pads are disposed, and a second region surrounding the first region, and
wherein the overhang portion is positioned in a portion of the second region.

20. A semiconductor package, comprising:
an interposer disposed on a package substrate;
a semiconductor chip disposed on the interposer;
a first underfill covering a lower surface of the interposer; and
a second underfill covering a lower surface of the semiconductor chip,
wherein at least a portion of the semiconductor chip forms an overhang portion protruding from one side surface of the interposer,
wherein, in a plan view, a width between the overhang portion of the semiconductor chip and the second underfill is about 0.1 mm to about 0.5 mm,
wherein the second underfill has an extension portion extending from a lower surface of the overhang portion to the package substrate, and
wherein the extension portion covers a side surface of the interposer and a portion of the first underfill, and protrudes from the overhang portion of the semiconductor chip in a plan view.

* * * * *